(12) United States Patent
Fowler et al.

(10) Patent No.: US 9,543,127 B2
(45) Date of Patent: Jan. 10, 2017

(54) METHOD AND TABLE ASSEMBLY FOR APPLYING COATINGS TO SPHERICAL COMPONENTS

(75) Inventors: Richard J. Fowler, Minerva, OH (US); Nickolas A. Grossi, Canton, OH (US); Doug H. Smith, Copley, OH (US); Gary L. Doll, Canton, OH (US); Ryan D. Evans, Massillon, OH (US)

(73) Assignee: The Timken Company, North Canton, OH (US)

( * ) Notice: Subject to any disclaimer, the term of this patent is extended or adjusted under 35 U.S.C. 154(b) by 214 days.

(21) Appl. No.: 14/378,103

(22) PCT Filed: Apr. 16, 2012

(86) PCT No.: PCT/US2012/033796
§ 371 (c)(1),
(2), (4) Date: Aug. 12, 2014

(87) PCT Pub. No.: WO2013/158067
PCT Pub. Date: Oct. 24, 2013

(65) Prior Publication Data
US 2015/0332900 A1   Nov. 19, 2015

(51) Int. Cl.
*C23C 16/00* (2006.01)
*H01J 37/34* (2006.01)
(Continued)

(52) U.S. Cl.
CPC ........ *H01J 37/3411* (2013.01); *C23C 14/0057* (2013.01); *C23C 14/35* (2013.01);
(Continued)

(58) Field of Classification Search
CPC .... C23C 14/35; C23C 14/0057; C23C 14/505; C23C 14/50
See application file for complete search history.

(56) References Cited

U.S. PATENT DOCUMENTS

| 5,098,483 A | * | 3/1992 | Little | C23C 16/458 148/239 |
| 6,302,573 B1 | * | 10/2001 | Morimoto | B01F 13/0266 366/106 |
| 2006/0172065 A1 | * | 8/2006 | Carlotto | B01J 2/006 427/212 |

FOREIGN PATENT DOCUMENTS

| CN | 101353777 | 1/2009 |
| EP | 0119631 | 9/1984 |

(Continued)

OTHER PUBLICATIONS

Japanese Office action for Japanese Patent Appln. 2015-506944, dated Nov. 24, 2015, 5 pages.
(Continued)

*Primary Examiner* — Kelly M Gambetta
(74) *Attorney, Agent, or Firm* — Michael Best & Friedrich LLP (57) ABSTRACT

A method of coating spherical components with a coating process in which the spherical components have a surface area includes positioning the spherical components within a containment boundary on a moving member and positioning the moving member within a chamber. The method includes reducing the pressure within the chamber to less than one atmosphere. The method also includes revolving the moving member about a longitudinal axis. The method further includes oscillating the moving member in a direction of the longitudinal axis and commencing the coating process. The oscillating and revolving produce motion of the spherical components within the containment boundary such that an entirety of the surface area of each component is exposed to the coating process.

17 Claims, 9 Drawing Sheets

(51) Int. Cl.
*C23C 16/458* (2006.01)
*C23C 14/00* (2006.01)
*C23C 14/50* (2006.01)
*C23C 14/35* (2006.01)

(52) U.S. Cl.
CPC ........ *C23C 14/505* (2013.01); *C23C 16/4584* (2013.01); *H01J 2237/3323* (2013.01)

(56) References Cited

FOREIGN PATENT DOCUMENTS

| | | |
|---|---|---|
| EP | 0408818 A1 | 1/1991 |
| EP | 0551737 | 7/1993 |
| JP | S60110870 | 6/1985 |
| JP | S60110870 A * | 6/1985 |
| JP | 4143274 | 5/1992 |
| JP | 5311409 | 11/1993 |
| JP | 2001336533 | 12/2001 |
| WO | 2006083725 A2 | 8/2006 |

OTHER PUBLICATIONS

European Examination Report for Application No. 12716980.3 dated Oct. 8, 2015 (6 pages).
International Search Report and Written Opinion for PCT/US2012/033796, dated Dec. 20, 2012, 9 pages.

\* cited by examiner

METHOD AND TABLE ASSEMBLY FOR APPLYING COATINGS TO SPHERICAL COMPONENTS

BACKGROUND

The present invention relates to a method and table assembly for applying coatings to spherical components.

Surface coating processes are widely used to produce high-quality thin films and coatings on components to increase wear resistance and provide other desirable properties. A variety of coating techniques are available for this purpose. For example, sputtering is a specific physical vapor deposition (PVD) coating process in which an inert gas, such as argon, is ionized in a vacuum chamber containing the component to be coated and a sputtering target. The argon ions bombard the sputtering target, dislodging target material atoms that then strike and coat the component. To increase the sputter rate and thereby decrease the time required to form the coating, a magnet can be used to produce a magnetic field closed-loop path to keep the free electrons near the target material, i.e., magnetron sputtering. In unbalanced magnetron sputtering, extra magnetic coils intensify the plasma close to the product, resulting in a denser coating. As a further refinement, known as closed field unbalanced magnetron sputtering, the magnets can be configured in such a way that the magnetic field confines the plasma and less target material is lost to the chamber walls.

SUMMARY

Many coating systems utilize vertically mounted sources of coating material positioned about the component(s) to be coated. For example, closed field unbalanced magnetron sputtering systems typically have sputtering targets mounted to magnetrons attached to the side walls of the vacuum chamber. The targets surround a fixture onto which are placed one or more components. Uniformly coating the entire surface of a spherical component, such as a ball for a ball bearing, presents a unique challenge due to the difficulty of manipulating the component(s) during deposition of the coating.

In one embodiment of a method of coating spherical components with a coating process in which the spherical components have a surface area, the method includes positioning the spherical components within a containment boundary on a moving member and positioning the moving member within a chamber. The method includes reducing the pressure within the chamber to less than one atmosphere. The method also includes revolving the moving member about a longitudinal axis. The method further includes oscillating the moving member in a direction of the longitudinal axis and commencing the coating process. The oscillating and revolving produce motion of the spherical components within the containment boundary such that an entirety of the surface area of each component is exposed to the coating process.

In one embodiment of a table assembly for use in coating spherical components at sub-atmospheric pressures, the table assembly includes a moving member defining a surface and operable to revolve about a longitudinal axis. The moving member includes a containment boundary on the surface. An oscillation member is configured to impart oscillatory motion to the moving member upon revolving of the moving member.

Other aspects of the invention will become apparent by consideration of the detailed description and accompanying drawings.

BRIEF DESCRIPTION OF THE DRAWINGS

FIG. 9b is a section view taken along line 9b-9b of FIG. 9a.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Figure 1:
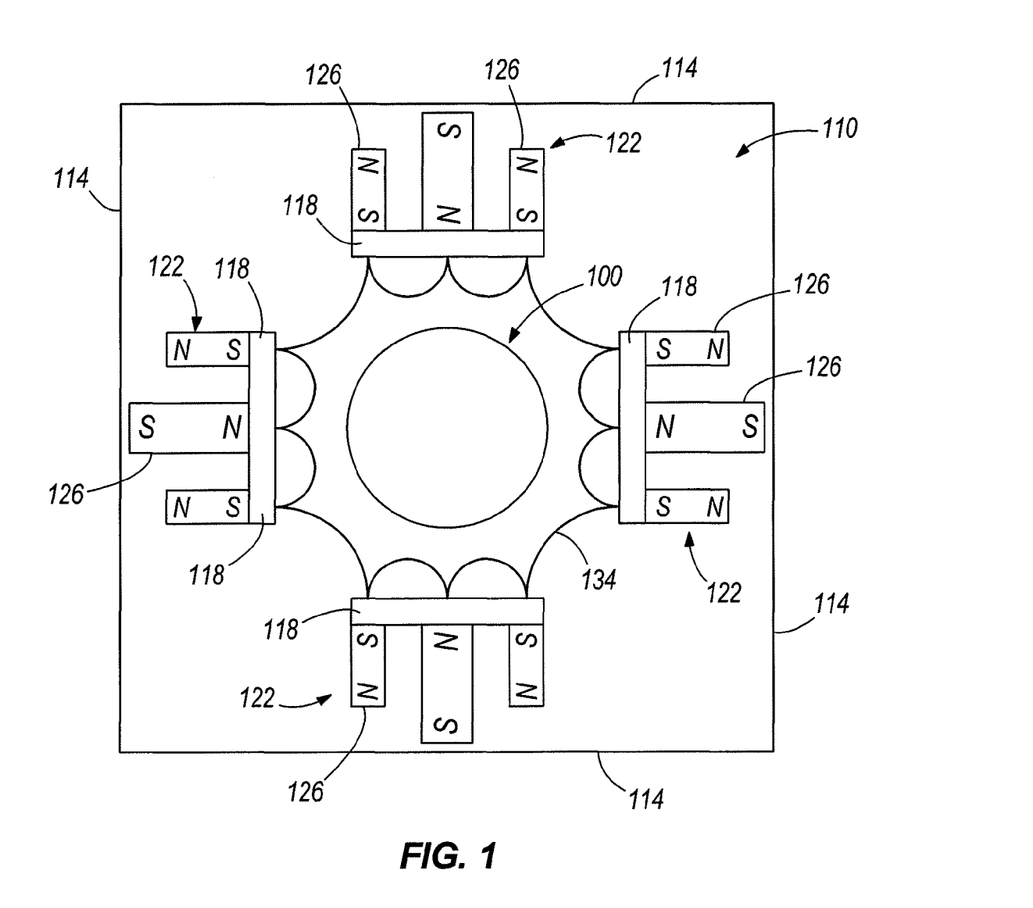
FIG. 1 is a schematic plan view of a table assembly within a magnetron sputtering vacuum chamber.

FIG. 1 illustrates a table assembly 100 for coating spherical components with a physical vapor deposition technique. Though the table assembly 100 is specifically depicted for use with a closed field unbalanced magnetron sputtering system, the table assembly 100 can be used with a variety of coating processes that use a line of sight approach from wall mounted coating or heating sources to the component(s) to be coated. Examples of such coating processes include, but are not limited to, laser-assisted deposition, cathodic arc evaporation, and high power impulse magnetron sputtering (HIPIMS). The table assembly 100 can also be used with combination coating systems in which a physical vapor deposition coating technique, e.g., reactive sputtering, is used with a chemical vapor deposition process. For example, the table assembly 100 can be used for an initial sputtering process to provide a base coating on the component, followed by continued coating deposition from the plasma phase within the chamber. Other combinations having at least one step utilizing a side wall mounted source are contemplated with the invention and could include, for example, plasma nitriding followed by sputtering, followed by plasma-assisted chemical vapor deposition.

Referring again to FIG. 1, the table assembly 100 is generally centrally located within a vacuum chamber 110 having a plurality of chamber side walls 114. Sputtering targets 118 containing material to be sputtered are mounted to magnetrons 122 attached to the walls 114, and each magnetron 122 includes a plurality of magnets 126 for producing a magnetic field. In a closed field magnetron unbalanced sputtering system, the magnets 126 are arranged such that the magnetic fields link (see exemplary field lines 134) and confine the plasma produced. Due to the relative position of the table assembly 100 with respect to the sputtering targets 118, closed field magnetron unbalanced sputtering deposition occurs directionally from the sides, i.e., from the side walls 114 to the centrally located table assembly 100. The physics behind the closed field unbalanced magnetron sputtering process are known to those of ordinary skill in the art and need not be further detailed.

Figure 2:
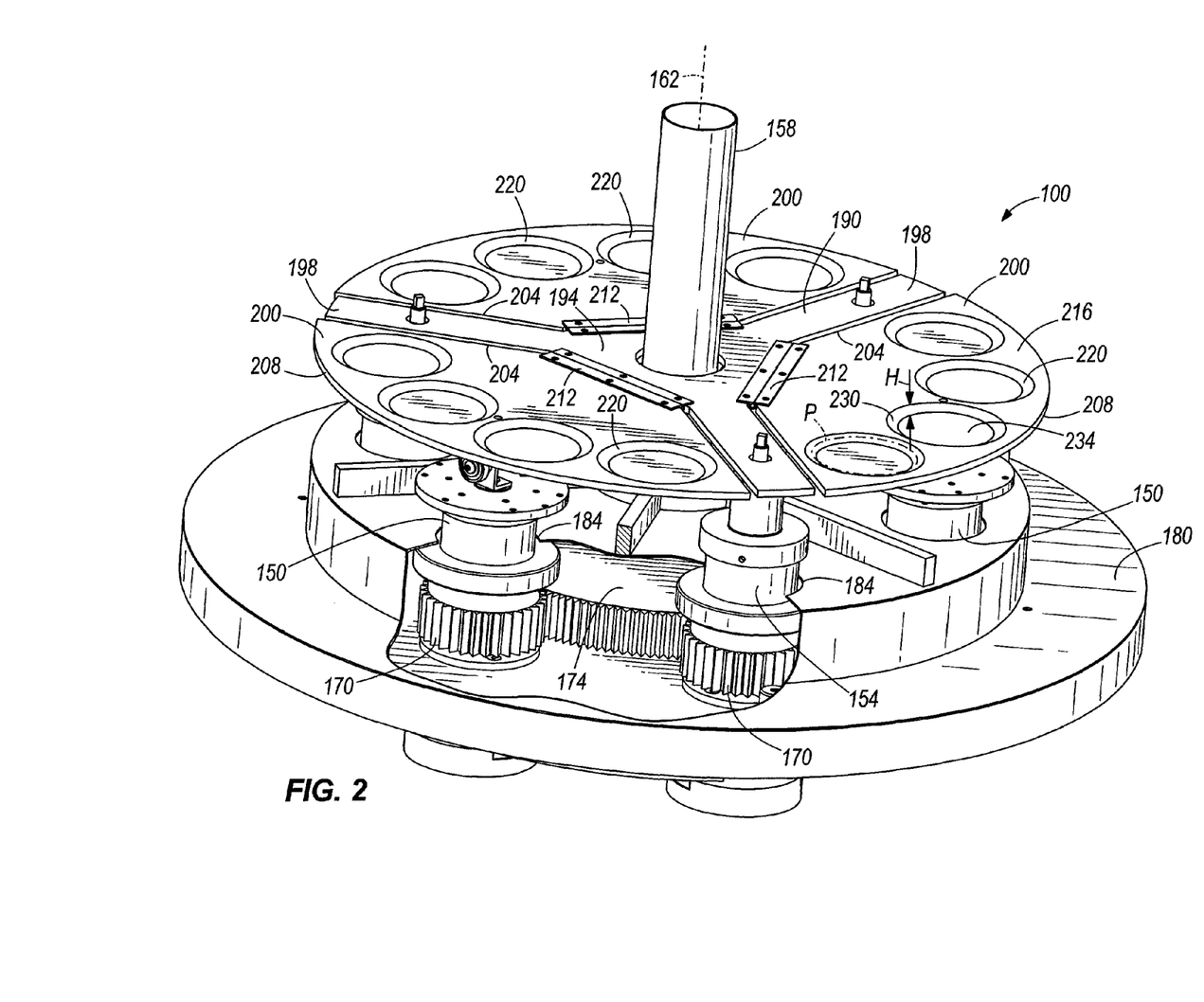
FIG. 2 is a perspective view of the table assembly of FIG. 1.
Figure 3:
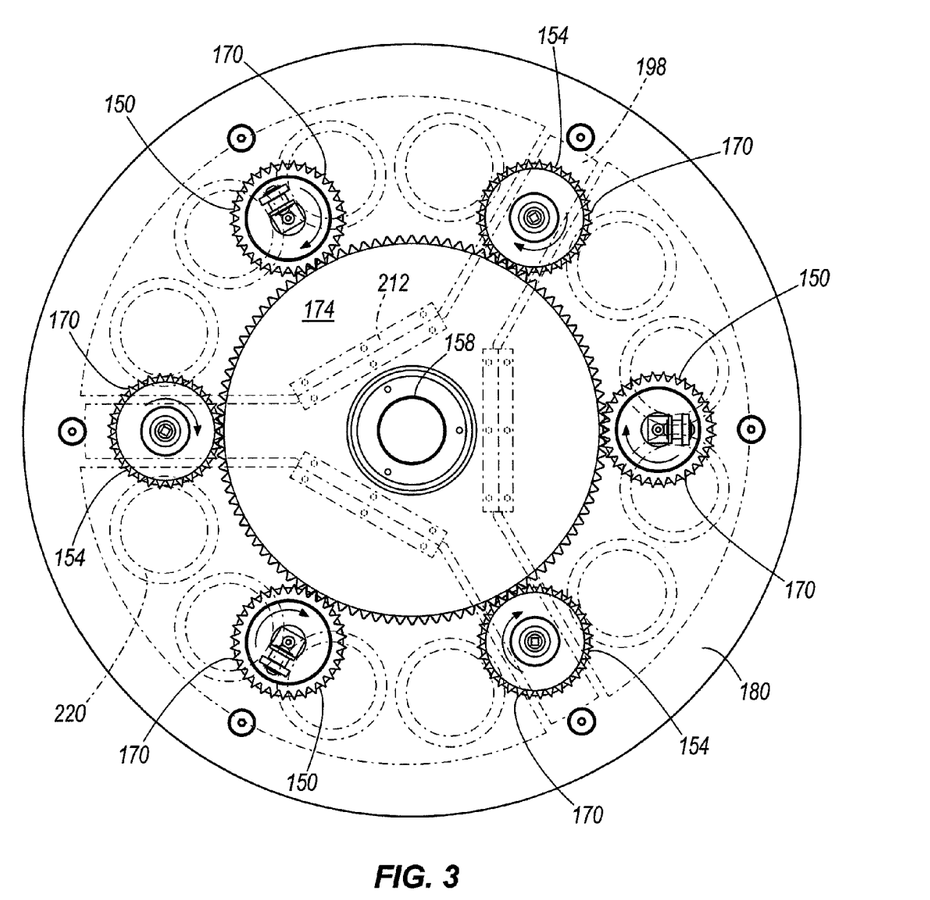
FIG. 3 is a partial top view of the table assembly of FIG. 2 showing portions of a gearing mechanism.

Referring to FIGS. 2-3, a plurality of oscillation members 150 and driving members 154 are coupled to a drive mechanism (not shown) for revolution about a fixed central post, or stinger 158 having a central longitudinal axis 162. The members 150, 154 are further rotatable, and each includes a gear 170, which cooperates with the teeth of a centrally disposed and fixed sun gear 174. A housing 180 covers and protects the aforementioned drive and gearing mechanisms and includes apertures 184 through which extend each of the oscillation members 150 and driving members 154.

Figure 4:
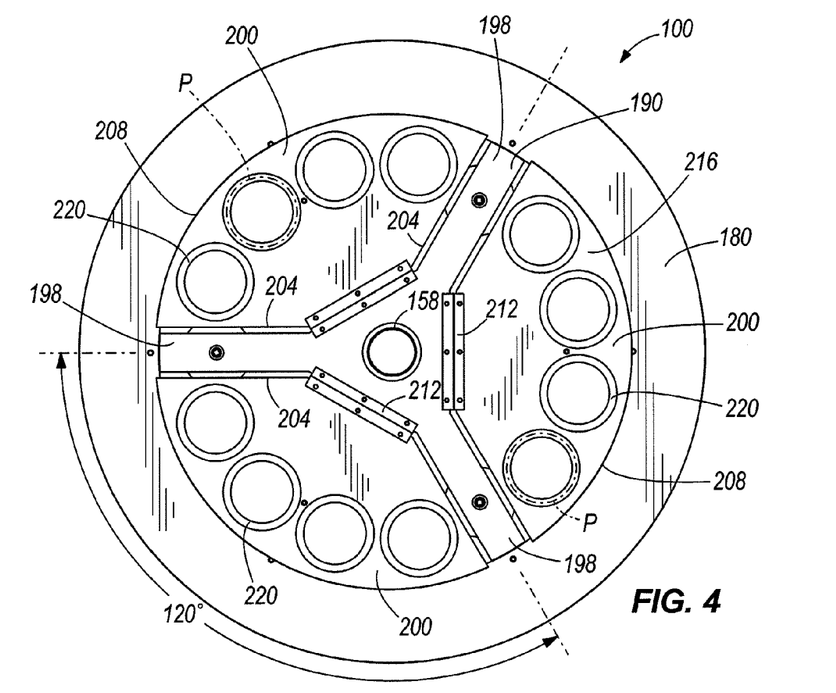
FIG. 4 is a plan view of the table assembly of FIG. 2.
Figure 5:
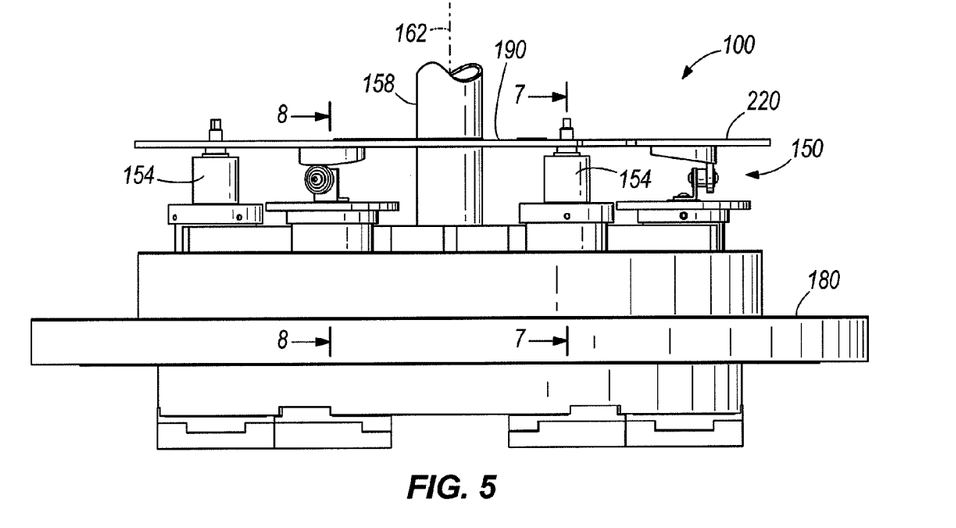
FIG. 5 is a side view of the table assembly of FIG. 2.

As shown in FIGS. 2, 4 and 5, a supporting member 190 having an interior portion 194 and support arms 198 overlies the housing 180 in operational contact with the driving members 154, as will be further detailed below. The support arms 198 are generally equally spaced about the central axis 162. For example, the three support arms 198 shown most readily in FIG. 4 are equally positioned 120° apart. Coupled to the interior portion 194 are moving members 200. Each moving member 200 includes sides 204 adjacent a support arm 198 and further defines an arcuate outer edge 208. As illustrated, the moving member 200, or platen, is pivotally coupled to the interior portion 194 of the supporting member 190 with a hinge member 212, though other movements are of course contemplated and within the scope of the invention.

Figure 6:
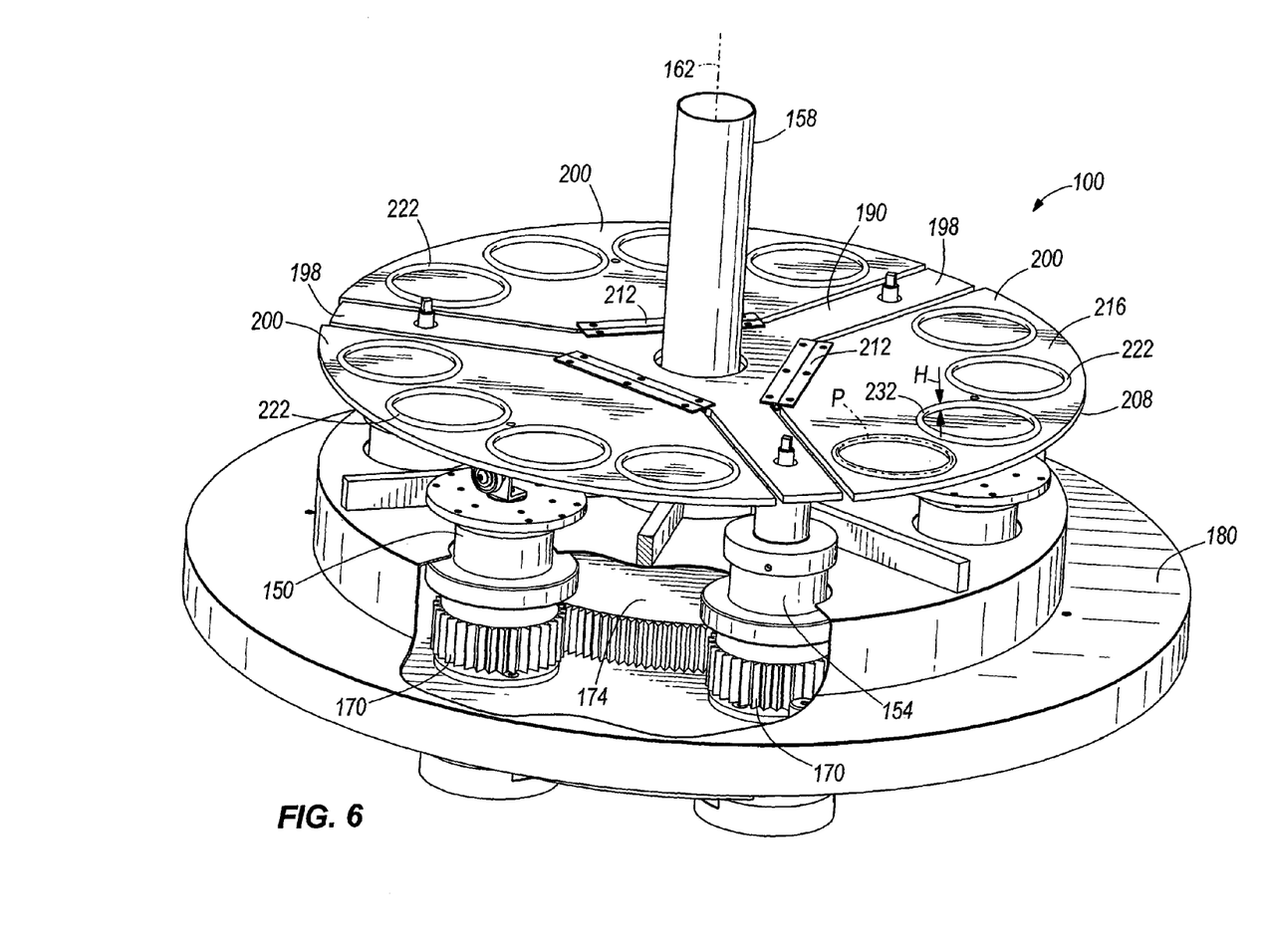
FIG. 6 is a perspective view of another construction of the table assembly of FIG. 1.

The moving member 200 includes a first surface 216 and one or more containment boundaries 220. As illustrated in FIG. 2, each containment boundary 220 can take the form of a pocket integrally formed as part of the moving member 200. Alternatively, as shown in FIG. 6, a containment boundary 222 can be a surface feature fixedly attached to the first surface 216 of the moving member 200. In either construction, the shape of the containment boundary 220, 222 can vary. As illustrated in FIGS. 2, 4, and 6, the containment boundary 220, 222 has a circular form. In other constructions, the containment boundary 220, 222 can have, for example, a nephroidal (kidney) shape.

Referring again to FIGS. 2, 4, and 6, for any shape, whether as a pocket or a surface feature, each containment boundary 220, 222 defines a perimeter of length P. Each containment boundary 220, 222 also defines an edge 230, 232 having a height H measured orthogonal to the first surface 216. With respect to FIG. 2 and a pocket containment boundary 220, the height H of the edge 230 represents a depth equal to the distance from the first surface 216 to the bottom 234 of the pocket. The containment boundaries 220, 222 are generally formed toward the arcuate edge 208 of the moving member 200 to enhance the effectiveness of the vapor deposition process and to maximize the number of containment boundaries 220, 222 available for each moving member 200. The containment boundaries 220, 222 in a single moving member 200 or among a number of moving members 200 in the table assembly 100 need not all be of the same dimensions or size.

Figure 7:
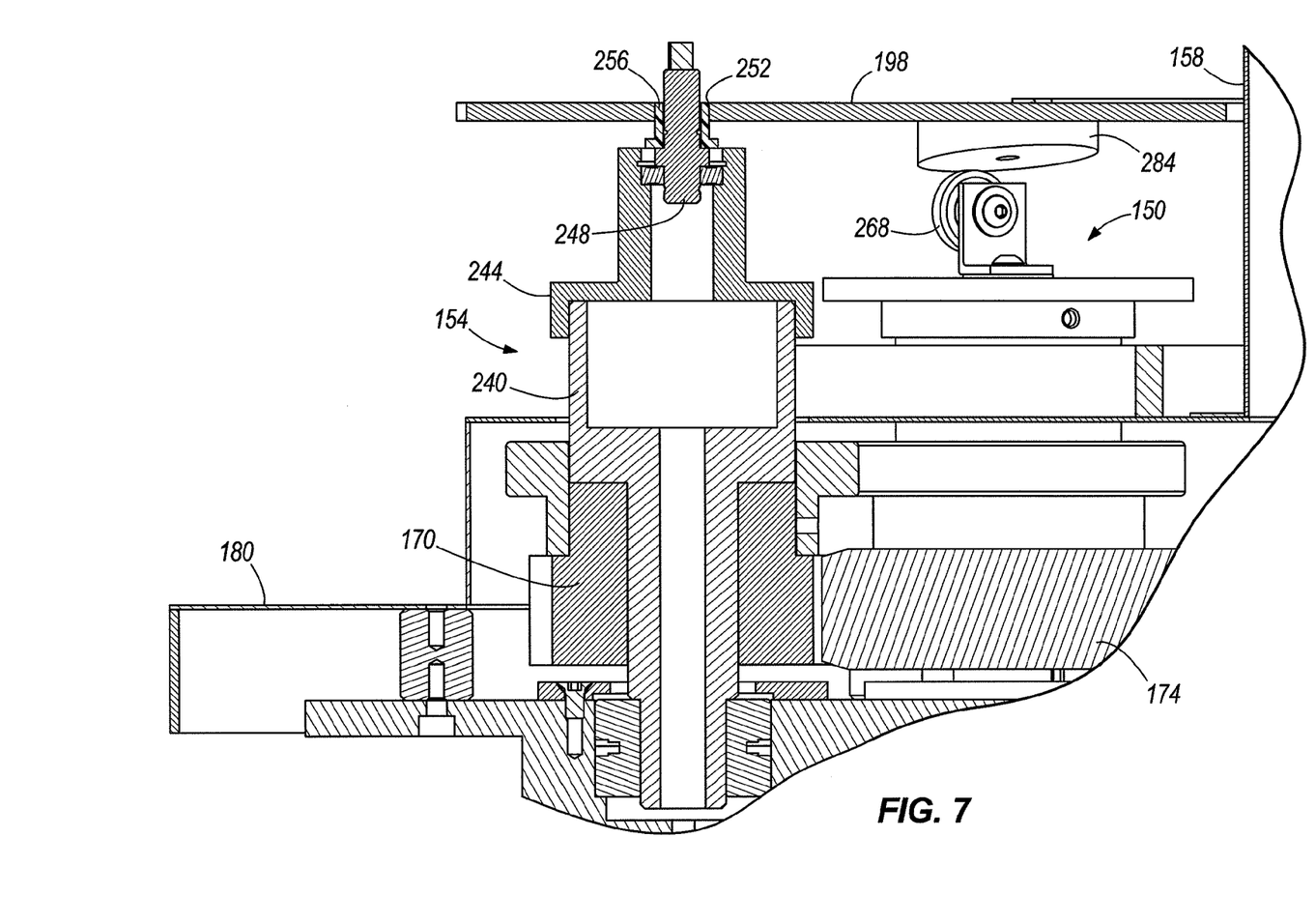
FIG. 7 is a partial section view taken along line 7-7 of FIG. 5.

Referring to FIG. 7, one of the driving members 154 is illustrated in further detail. As noted previously, the gear 170 of the driving member 154 is in a geared relationship with the central fixed sun gear 174 and is configured to revolve about the stinger 158 and to rotate upon revolution. A spindle 240 is coupled to the gear 170 for co-rotation therewith and a mounting piece 244 atop the spindle 240 receives and secures a support pin 248, which extends through an aperture 252 in the support arm 198. A shouldered bushing 256 disposed between the support pin 248 and the perimeter of the aperture 252 and fixed to the support arm 198 maintains operational contact between the pin 248 and the support arm 198.

Figure 8:
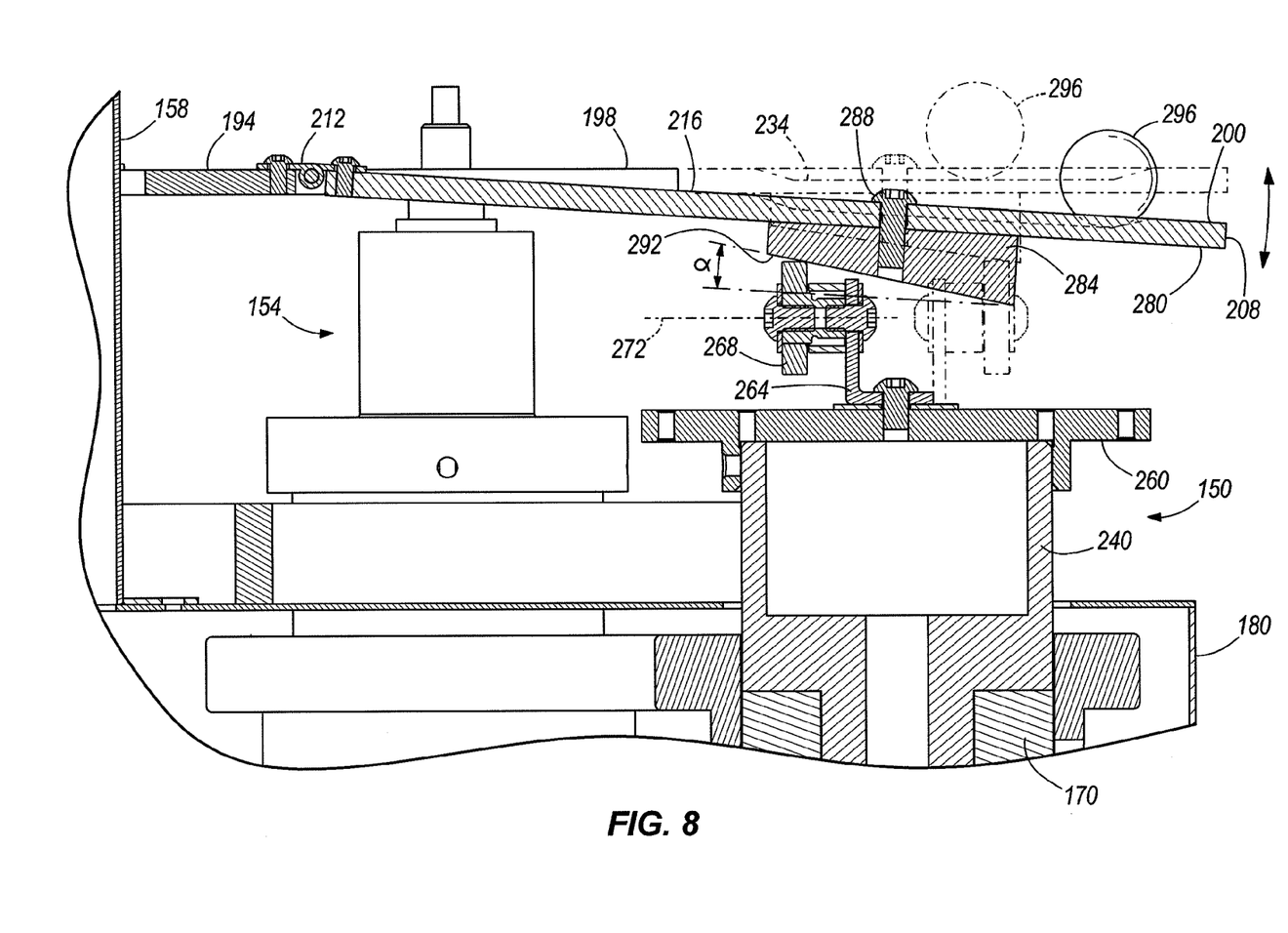
FIG. 8 is a section view taken along line 8-8 of FIG. 5.

Referring to FIG. 8, the oscillation member 150 is additionally detailed. As with the driving member 154, the oscillation member 150 includes a gear 170 in a geared relationship with the sun gear 174 (not shown) to rotate a spindle 240 upon revolution. Secured to the top of the spindle 240 is a platform 260. A support bracket 264 is centrally fastened to the platform 260. A rolling element 268, for example, a ball bearing, is removably attached to the support bracket 264 such that the rolling element 268 is freely rotatable about a rotation axis 272 substantially orthogonal to the central axis 162 of the stinger 158.

With continued reference to FIG. 8, the underside, or second surface 280, of the moving member 200 includes a cam element 284 removably attachable with a fastener 288. The cam element 284 presents a cam surface 292 in proximity to the rolling element 268 of the oscillation element 150. The angle of the cam surface 292 varies with the size of the spherical component 296 to be coated. For example, a spherical component 296 having a 15 millimeter diameter can have a cam surface angle α between about 1° and about 10° measured from the second surface 280, and which is preferably approximately 8.5°. In a system structured to have multiple moving members 200 (see, e.g. FIGS. 2 and 6), the cam elements 284 coupled to each moving member 200 are adjustable such that the moving members 200 are either in phase or out of phase. If out of phase, for example, at any given moment, each rolling element 268 contacts a different portion of its adjacent cam surface 292 such that the furthest radial point on the outer edge 208 of each moving member 200 concurrently lies at a different axial position along the central axis 162. Though illustrated with the cam element 284 coupled to the moving member 200 and the rolling element 268 coupled to the oscillation member 150, in other constructions the cam element 284 may be coupled to the oscillation member 150, and the rolling element 268 may be coupled to the moving member 200.

Figure 9A:
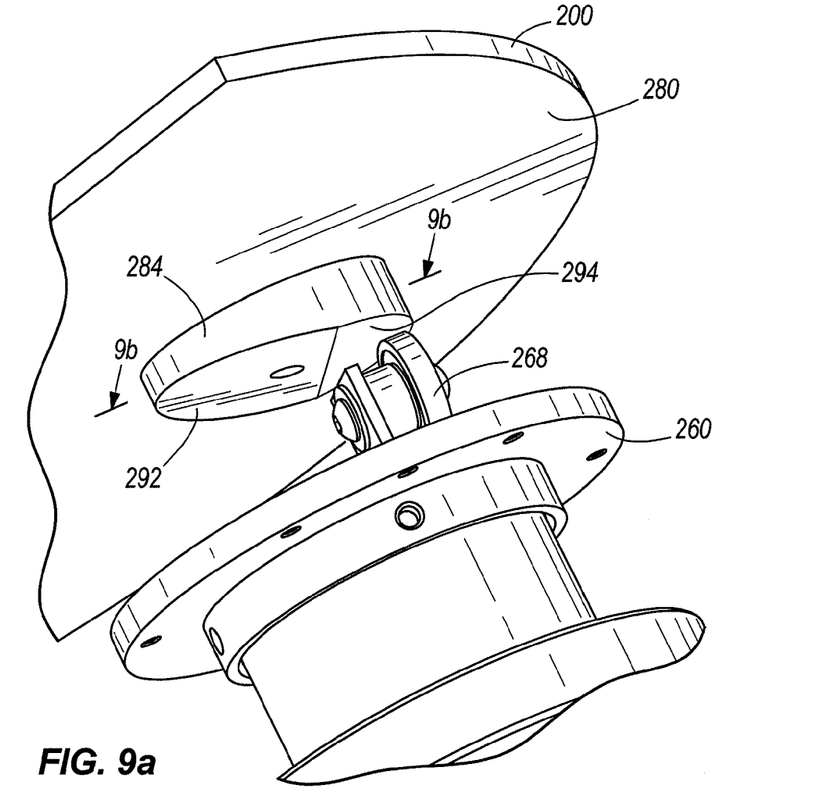
FIG. 9a is a perspective view of an alternative cam element of the table assembly of FIG. 2
Figure 9B:
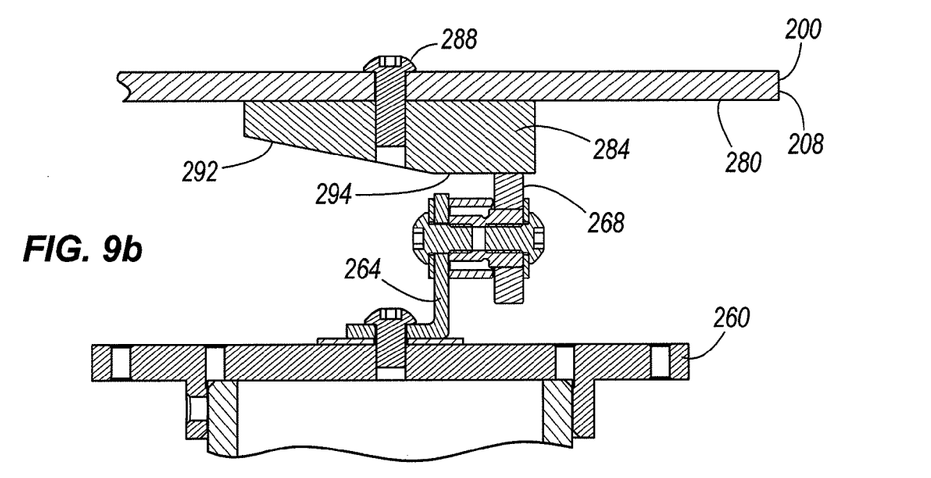

As an alternative, a portion of the cam surface 292 of the cam element 284 can define one or more ledges 294, a single one of which is illustrated in FIGS. 9a and 9b. In yet another alternative (not shown), the cam surface 292 can include one or more surface contours, such as waves or other undulating features. The ledge(s) 294 and other surface contours affect the profile of the oscillatory motion and therefore impart a degree of motion control to the spherical components 296 during the coating process. For example, during contact between the ledge 294 of FIGS. 9a-9b, the surface of which is parallel to the second surface 280, and the rolling element 268, the furthest radial point on the outer edge 208 of the moving member maintains the same axial position along the axis 162. The degree of motion control is dependent on additional factors, such as the size of the spherical components 296 and the size and shape of the containment boundaries 220, 222.

The table assembly 100 of FIGS. 2 and 6 includes three oscillation members 150 and three driving members 154. The support member 190 has three support arms 198 and is coupled to three moving members 200. The table assembly 100 is not limited to such a structural arrangement, however. For example, the table assembly 100 may be substantially as described but utilize only one moving member 200. Alternatively, the table assembly 100 can have as few as two oscillation members 150 and two driving members 154, with a support member 190 having two support arms 198 on either side of two moving members 200. In another alternative, the table assembly 100 can have four or more of each of the oscillation members 150, driving members 154, support arms 198, and moving members 200, as may be desired for a particular application.

Figure 10:
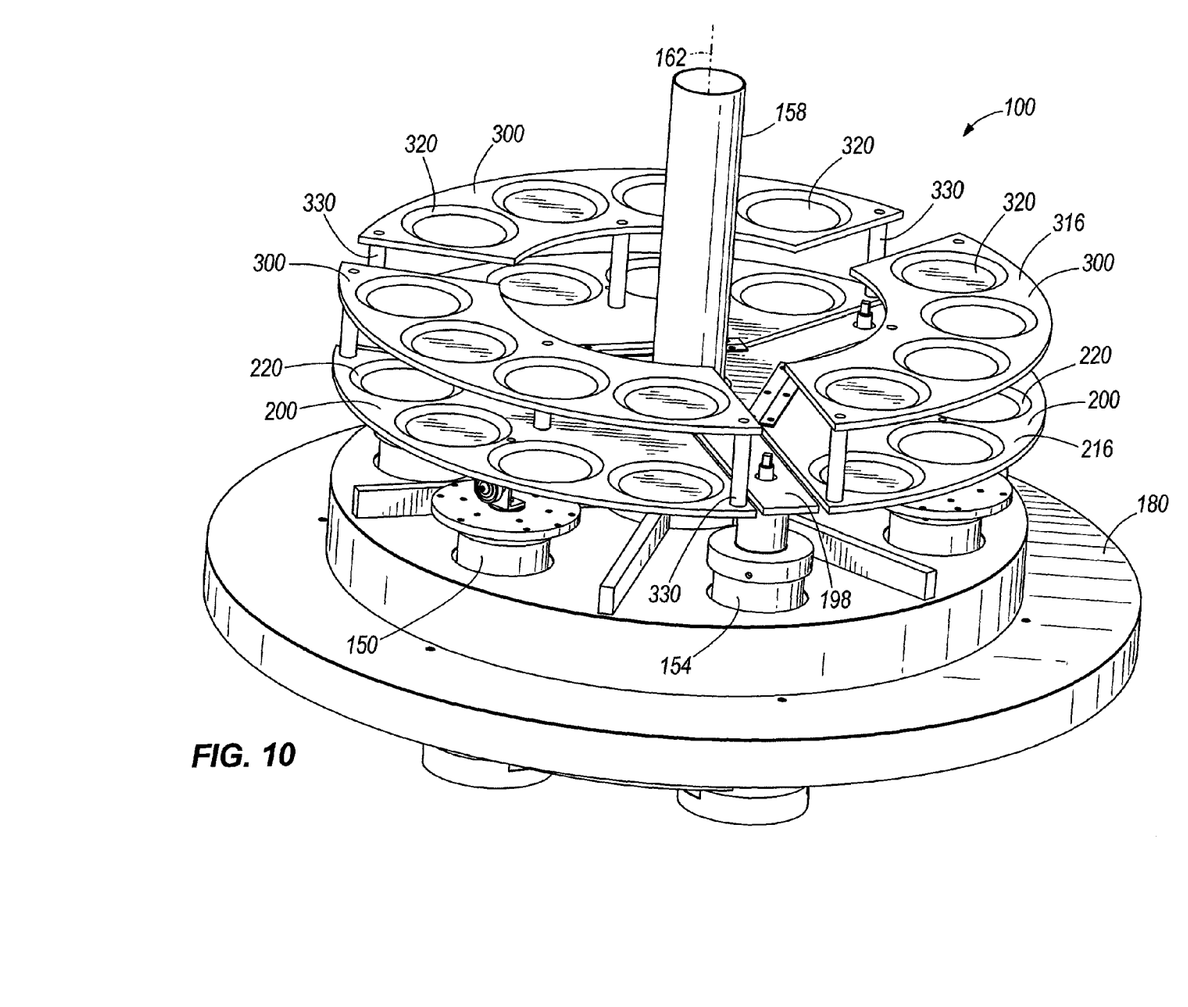
FIG. 10 is a perspective view of another construction of the table assembly of FIG. 1.

Referring to FIG. 10, a second moving member 300 can be axially spaced a certain distance from the first moving member 200 (i.e., in stacked relation). The second moving member 300 can be substantially identical to the first moving member 200, as shown in FIG. 10, or can be differently configured. For example, the containment boundaries 220 of the first moving member 200 can be formed as circular pockets while the containment boundaries 320 of the second moving member 300 can be, for example, nephroidal pockets. Alternatively, the containment boundaries 220 of the first moving member 200 can be integrally formed pockets while the containment boundaries 320 of the second moving member 300 can be, for example, surface features fixedly attached to a first surface 316 of the second moving member 300. The second moving member 300 is rigidly coupled to the first moving member 200 such that motion of the first moving member 200 results in identical motion of the second moving member 300, as will be further described below. One or more studs 330 are used to separate the moving members 200, 300, and the studs 330 are adjustable, permitting variation in the operational distance between the moving members 200, 300 in response to the needs of differently sized spherical components 296. This application-dependent operational distance can range, for example, from approximately 2" to approximately 6". In addition, the table assembly 100 is not limited to a single spacing, or stacking, of moving members 200, 300, and can include three or more axially spaced moving members to form a multi-tiered structure.

The components of the aforementioned table assembly 100 are constructed of metal, preferably of stainless steel or another electrically conductive material well-suited for vacuum applications. In addition, during some coating processes the table assembly 100 is further electrically biased with a negative charge. This imparts a negative charge to the spherical components, which remain in contact with the table assembly 100 throughout the process, to facilitate a dense coating microstructure and adhesion of the coating. The metal construction of the table assembly 100 permits ion current generated from electrostatic attraction between the spherical components and the plasma ions to flow from the spherical components to the table assembly 100.

Referring to FIGS. 2, 3, 6 and 8, in operation, a number N of spherical components 296 (see FIG. 8), each having a diameter D and a surface area to be coated, is placed or positioned within a containment boundary 220, 222 formed in one or more moving members 200. For a given containment boundary 220, 222, the diameter D of the spherical components 296 within should not be less than 4H, where H is as previously identified. Additionally, the number N is preferably determined such that N×D is less than or equal to P, the perimeter of the containment boundary 220, 222. Because each containment boundary 220, 222 of the table assembly 100 need not have the same dimensions, the number N can vary within the containment boundaries 220, 222 associated with a moving member 200 or among two or more moving members 200. In addition, spherical components having a first diameter can be placed in one containment boundary 220, 222, while spherical components having a second diameter can be placed in another containment boundary 220, 222, under the aforementioned guidelines.

Once the spherical components 296 are positioned, the table assembly 100 is inserted into the vacuum chamber 110 for deposition, and the vacuum chamber 110 is sealed from the external atmosphere. The pressure within the vacuum chamber 110 is reduced to below 1 atmosphere (1 atm, 760 torr). Preferably, the pressure within the chamber 110 is reduced to at or below 10 millitorr. The drive mechanism drives the oscillation members 150 and the driving members 154 at a fixed radius about the central axis 162 at a user-defined angular velocity, for example, one rotation per minute. The gears 170 of the oscillation members 150 and driving members 154 cooperate with the fixed sun gear 174 to rotate the members 150, 154 during revolution, resulting in planetary motion of the members 150, 154 about the central axis 162 throughout the deposition process.

The driving members 154, operably coupled to the support arms 198 through the support pin 248, rotate the supporting member 190 about the central axis 162. This, in turn, revolves the attached moving members 200 at the same angular velocity. Concurrently, the rolling elements 268 fixedly mounted to the revolving platforms 260 of the oscillation members 150 rotate in contact with the cam surfaces 292 to force the moving members 200 to rise and fall, or oscillate, in the direction of the central axis 162. During this oscillation, the spherical components 296 roll within the containment boundaries 220, 222, as shown, for example, in FIG. 8. Specifically, the oscillating and revolving produce random-like motion of the spherical components 296 within each containment boundary 220, 222. The spherical components 296 maintain electrical contact with the table assembly 100, and more specifically with the moving member 200, during this random-like motion. With reference to FIG. 10, identical oscillation occurs in a rigidly coupled first moving member 200 and second moving member 300.

The combination of the oscillatory motion imparted to, and the shape of, each containment boundary 220, 222 maintains constant random motion of the spherical components 296 during operation of the table assembly 100. Containment boundaries 220, 222 with circular and nephroidal shapes have been found to be particularly effective in exposing the entirety of the surface area of each component 296 to the sputtering target 118, enabling uniform and homogeneous coating of the surface area during the deposition process.

Various features and advantages of the invention are set forth in the following claims.

What is claimed is:

1. A table assembly for use in coating spherical components at sub-atmospheric pressures, the table assembly including:
   a moving member defining a surface and operable to revolve about a longitudinal axis, wherein the moving member includes a containment boundary on the surface; and an oscillation member configured to impart oscillatory motion to the moving member upon revolving of the moving member;

wherein the surface is a first surface, and wherein the moving member further defines a second surface, and further wherein the moving member includes one of a cam element or a rolling element coupled to the second surface, and wherein the oscillation member further includes the other one of the cam element or the rolling element in operational contact with the one of the cam element or the rolling element coupled to the second surface to impart the oscillatory motion to the moving member upon rotation of the oscillation member.

2. The table assembly of claim 1, further including a supporting member that rotates about the longitudinal axis, and wherein the moving member is coupled to the supporting member.

3. The table assembly of claim 2, wherein the moving member is hingedly coupled to the supporting member for pivoting movement.

4. The table assembly of claim 2, further including a driving member disposed in proximity to a portion of the supporting member and configured to revolve about the longitudinal axis, wherein the driving member rotates the supporting member about the longitudinal axis.

5. The table assembly of claim 1, wherein the cam element presents to the rolling element a cam surface angled at a non-zero angle relative to the second surface.

6. The table assembly of claim 1, wherein the cam element presents to the rolling element a cam surface angled at a non-zero angle relative to the second surface and a ledge defining a surface parallel to the second surface.

7. The table assembly of claim 1, wherein the containment boundary is integrally formed as part of the surface.

8. The table assembly of claim 7, wherein the containment boundary forms a pocket in the moving member.

9. The table assembly of claim 1, wherein the containment boundary forms a circle.

10. The table assembly of claim 1, wherein the containment boundary is substantially nephroidal in shape.

11. The table assembly of claim 1, wherein the containment boundary is a surface feature fixedly attached to the first surface.

12. The table assembly of claim 1, wherein the moving member includes a plurality of moving members, each moving member having a respective first surface and an opposing second surface, and wherein each moving member includes a containment boundary formed on the first surface.

13. The table assembly of claim 12, wherein each moving member further includes one of a cam element or a rolling element coupled to the second surface.

14. The table assembly of claim 1, wherein the moving member is a first moving member, and further including a second moving member coupled to the first moving member and spaced apart therefrom along the longitudinal axis.

15. The table assembly of claim 14, wherein the second moving member is spaced between about 2" and about 641 from the first moving member.

16. The table assembly of claim 1, wherein the containment boundary defines a perimeter of length P, and is sized to receive a number N of spherical components, each having a diameter D, within the containment boundary such that N×D is less than or equal to P.

17. The table assembly of claim 1, wherein the containment boundary defines an edge having a height H orthogonal to the surface, and further wherein the containment boundary is sized to receive a number N of spherical components, each having a diameter D, within the containment boundary, wherein D is greater than or equal to 4H.

\* \* \* \* \*